(12) United States Patent
Lindner

(10) Patent No.: US 12,321,552 B2
(45) Date of Patent: Jun. 3, 2025

(54) CONTROL DEVICE FOR A MOTOR VEHICLE

(71) Applicant: Bayerische Motoren Werke Aktiengesellschaft, Munich (DE)

(72) Inventor: Matthias Lindner, Graefelfing (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 0 days.

(21) Appl. No.: 18/294,625

(22) PCT Filed: Aug. 2, 2022

(86) PCT No.: PCT/EP2022/071687
§ 371 (c)(1),
(2) Date: Feb. 2, 2024

(87) PCT Pub. No.: WO2023/025538
PCT Pub. Date: Mar. 2, 2023

(65) Prior Publication Data
US 2024/0343188 A1    Oct. 17, 2024

(30) Foreign Application Priority Data
Aug. 25, 2021 (DE) .................. 10 2021 121 955.8

(51) Int. Cl.
*G06F 3/044* (2006.01)
*B60Q 3/70* (2017.01)
*G03B 21/20* (2006.01)
*B60Q 3/80* (2017.01)

(52) U.S. Cl.
CPC ............... *G06F 3/044* (2013.01); *B60Q 3/70* (2017.02); *G03B 21/208* (2013.01); *B60Q 3/80* (2017.02); *G06F 2203/04108* (2013.01)

(58) Field of Classification Search
CPC . G06F 3/044; G06F 2203/04108; B60Q 3/70; B60Q 3/80; G03B 21/208
See application file for complete search history.

(56) References Cited

U.S. PATENT DOCUMENTS

| 9,092,136 B1 | 7/2015 | Patel et al. |
| 11,097,658 B1 | 8/2021 | Mazuir et al. |

(Continued)

FOREIGN PATENT DOCUMENTS

| DE | 10 2008 060 363 A1 | 6/2010 |
| DE | 10 2018 009 543 A1 | 6/2019 |

(Continued)

OTHER PUBLICATIONS

International Search Report (PCT/ISA/210) issued in PCT Application No. PCT/EP2022/071687 dated Nov. 11, 2022 with English translation (4 pages).

(Continued)

*Primary Examiner* — Lisa S Landis
(74) *Attorney, Agent, or Firm* — Crowell & Moring LLP

(57) ABSTRACT

A control device for a motor vehicle, comprising a display element, a projection unit, and a capacitive proximity sensor. At least one control element can be projected onto a visible surface of the display element by the projection unit. Actuation of the control element can be detected by the capacitive proximity sensor.

17 Claims, 1 Drawing Sheet

(56) References Cited

U.S. PATENT DOCUMENTS

| | | | |
|---|---|---|---|
| 2014/0043589 A1* | 2/2014 | Chifu | G03B 21/204 |
| | | | 353/31 |
| 2016/0288462 A1* | 10/2016 | Yin | B32B 27/06 |
| 2018/0108207 A1* | 4/2018 | Lyons | G07F 17/3211 |
| 2019/0377253 A1* | 12/2019 | Su | G03B 21/60 |
| 2022/0073089 A1 | 3/2022 | Lottes et al. | |

FOREIGN PATENT DOCUMENTS

| | | |
|---|---|---|
| DE | 10 2019 002 884 A1 | 10/2019 |
| WO | WO 2020/148060 A1 | 7/2020 |

OTHER PUBLICATIONS

German-language Written Opinion (PCT/ISA/237) issued in PCT Application No. PCT/EP2022/071687 dated Nov. 11, 2022 with English translation (8 pages).

German Search Report issued in German Application No. 10 2021 121 955.8 dated Jun. 22, 2022 with partial English translation (12 pages).

* cited by examiner

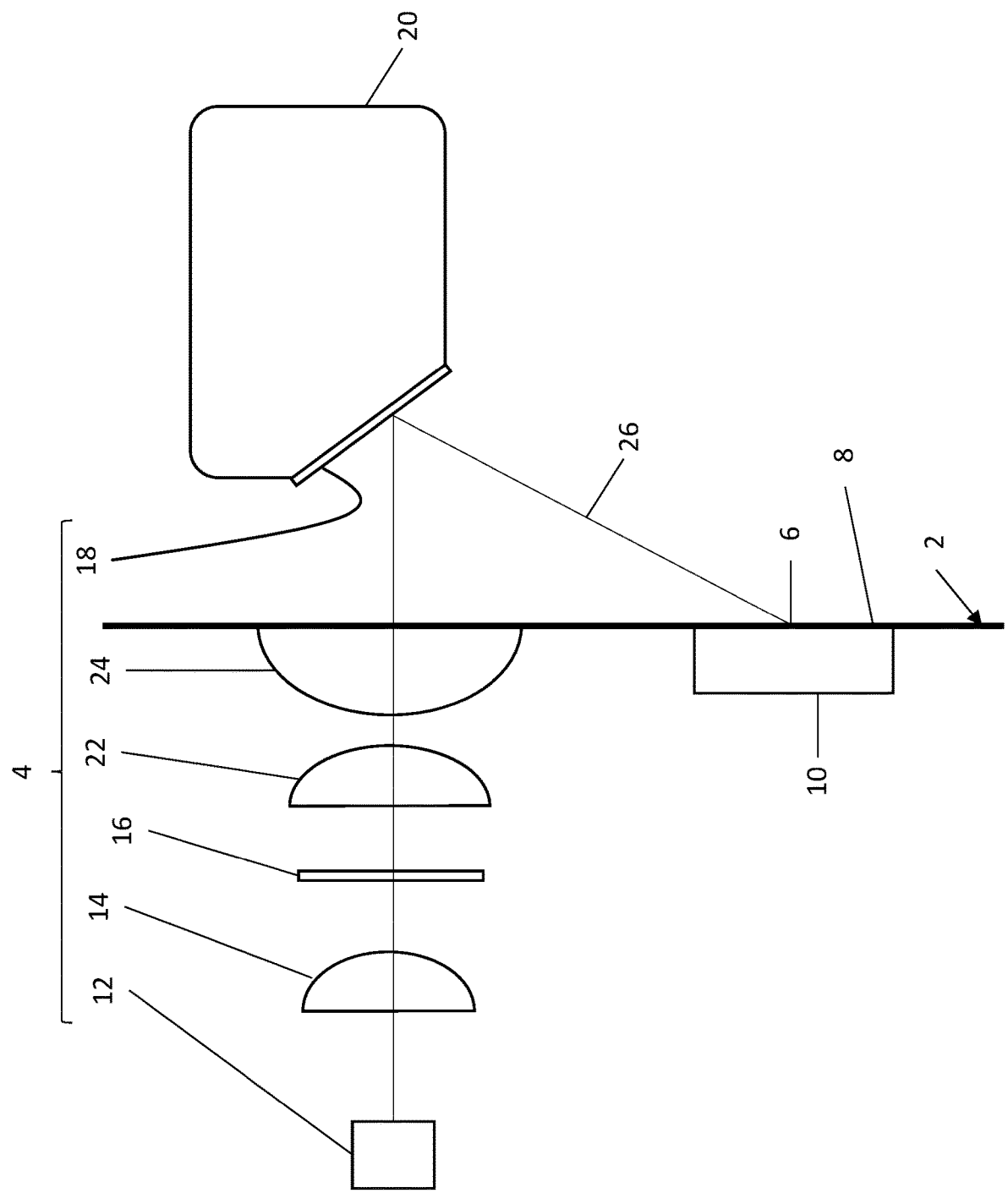

CONTROL DEVICE FOR A MOTOR VEHICLE

BACKGROUND AND SUMMARY

The present invention relates to a control device for a motor vehicle having the features as disclosed herein.

Various control devices for motor vehicles are known from the prior art.

DE 10 2008 060 363 A1 discloses a control system for controlling functions in a motor vehicle. The control system comprises an optical projection apparatus for graphically reproducing virtual control elements on an associated representation surface of a vehicle interior trim and a detection apparatus. The detection apparatus has a pressure-sensitive film which detects control inputs when the virtual control elements are actuated.

In order to give the vehicle interior a pleasing appearance, the vehicle interior trim or part thereof is as a rule made from a soft material such as fabric, leather and/or an imitation leather. However, these materials dampen the pressure exerted on the virtual control element upon actuation to such an extent that the actuation is no longer detectable by the pressure-sensitive film known from DE 10 2008 060 363 A1.

DE 10 2019 002 884 A1 describes a control device comprising a projection apparatus, a detection apparatus, an evaluation apparatus, and a display element. Using the projection apparatus, a control element is projectable as an image onto the display element using visible light beams in a manner such that it is possible for a user to exert influence on the control element. The detection apparatus detects the influence exerted by the user on the control element. The control device comprises at least one infrared source for projecting infrared radiation onto the display element. The detection apparatus has an infrared receiver. The infrared receiver receives the infrared radiation reflected by the display element and/or by the user exerting influence on the control element.

The infrared source and the infrared receiver thus need to be positioned in the interior of a motor vehicle such that they are directed, corresponding to the control element, toward the display element. Owing to the arrangement of the infrared source and of the infrared receiver in the interior of the motor vehicle, they are at high risk of being damaged. As a result, the operational safety of the control device known from DE 10 2019 002 884 A1 is low. In addition, the infrared source and the infrared receiver require a great amount of installation space in the interior of the motor vehicle. Furthermore, the detection apparatus described in DE 10 2019 002 884 A1 is susceptible to errors because the infrared receiver also detects the infrared component of sunlight during the day, and the measurement result is thus influenced by ambient conditions.

Proceeding from the control device known from DE 10 2019 002 884 A1, it is an object of the present invention to provide a control device which has a high level of operational safety and a low susceptibility to errors and requires little installation space.

This object is achieved by the control device having the features as disclosed herein.

According to the invention, a control device for a motor vehicle, comprising a display element, a projection apparatus, and a capacitive proximity sensor, is thus provided. Using the projection apparatus, at least one control element is projectable onto a viewing surface of the display element. Using the capacitive proximity sensor, an actuation of the control element, in particular contact with the control element and/or an approaching movement toward the control element, is detectable.

It is thus one of the core ideas of the invention to provide a control device in which the control element is projected onto the display element. Actuation of the control element is detectable by the capacitive sensor, which requires little installation space.

The capacitive sensor is arranged at the display element, in particular on a side of the display element facing away from the viewing surface, that is to say facing away from a vehicle occupant. Since the capacitive sensor does not project into an interior of the motor vehicle, the likelihood of the capacitive sensor being damaged is low. Consequently, the control device according to the invention has a high level of operational safety.

In one preferred embodiment of the control device according to the invention, the display element is non-conductive, that is to say it is made from a material that does not conduct electricity.

The display element can be made from a soft material. Consequently, it is possible to change the shape of the display element by exerting little force.

The display element is made for example from a non-transparent material. Consequently, it is not possible for light to pass through the display element.

In one exemplary embodiment of the control device according to the invention, the display element is a textile, a leather and/or an imitation leather.

The capacitive proximity sensor can be arranged at the display element.

The capacitive proximity sensor is arranged for example at a side of the display element that lies opposite the viewing surface.

An insulator, that is to say an intermediate element made from a non-conductive material, in particular made from a foam, can be arranged between the display element and the capacitive proximity sensor.

In one exemplary embodiment, the control device according to the invention comprises a shielding apparatus for selectively influencing an effective region of the capacitive proximity sensor. The shielding apparatus defines a desired extent and direction of the electric field emanating from the capacitive proximity sensor. This ensures that the capacitive proximity sensor detects an actuation of the control element only within a defined actuation region.

In one preferred embodiment of the control device according to the invention, the projection apparatus comprises a light source for generating visible light beams, a multiplicity of lenses for capturing and for parallelizing the light beams, a projection object to be projected, and a reflection surface. Using the reflection surface, the light beams are projectable onto the viewing surface such that the projection object is visible in the form of the control element.

The light source is a light-emitting diode, for example.

The reflection surface can be mirrored.

In one exemplary embodiment of the control device according to the invention, the light source, the multiplicity of lenses, and the projection object are arranged on a side of the display element facing away from the light surface. The reflection surface is arranged on the side of the viewing surface such that it can project the light beams generated by the light source onto the viewing surface of the display element as the control element.

The projection object is arranged between the lenses of the multiplicity of lenses.

In one preferred embodiment of the control device according to the invention, the reflection surface is arranged at a further control device.

The further control device can have a three-dimensional design and can be arranged at the side of the viewing surface.

The further control device is a seat adjuster, for example.

In one exemplary embodiment, the control device according to the invention comprises an evaluation apparatus. Using the evaluation apparatus, a signal corresponding to the detected actuation is generable, in particular in the manner of a switch signal for controlling and/or triggering a function of the motor vehicle.

The function of the motor vehicle can be seat adjustment.

The invention will be explained in more detail below with reference to an exemplary embodiment illustrated in the drawing.

BRIEF DESCRIPTION OF THE DRAWING

FIG. 1 shows a side view of a control device for a motor vehicle according to the present disclosure.

DETAILED DESCRIPTION OF THE DRAWING

FIG. 1 shows a control device for a motor vehicle according to the present disclosure.

The control device comprises a display element 2 having a viewing surface 8, which faces a vehicle occupant, a projection apparatus 4, and a capacitive proximity sensor 10. Using the projection apparatus 4, at least one control element 6 is projectable onto the viewing surface 8 of the display element 2. An actuation of the control element 6 by way of a vehicle occupant is detectable by the capacitive proximity sensor 10, which is arranged on a side of the display element 2 facing away from the viewing surface 8, that is to say from the vehicle occupant.

The display element 2 is made from a soft material, that is to say it is such that it is possible to change its shape by exerting little force. The soft material is non-conductive. The display element 2 forms an internal door trim.

The projection apparatus 4 comprises a light source 12 in the form of a light-emitting diode, a first lens 14 for capturing the light beams 26 from the light source 12, a projection object 16 that is to be projected, a second lens 22 and a third lens 24 for parallelizing the light beams 26, and also a mirroring reflection surface 18.

The light source 12, the first lens 14, the projection object 16, the second lens 22, and the third lens 24 are arranged in the aforementioned order on a side of the display element 2 facing away from the viewing surface 8, wherein the light source 12 is located the farthest from the display element 2.

The reflection surface 18 is arranged at a further control element 26. The further control element 26 is a three-dimensional seat adjuster.

The capacitive proximity sensor 10 is arranged at the side of the display element 2 which is not visible to the vehicle occupant such that the capacitive proximity sensor 10 can detect an actuation of the projected control element 6 or an approaching movement toward the projected control element 6 by way of the vehicle occupant.

If the capacitive proximity sensor 10 detects contact with the control element 6 and/or an approaching movement toward the control element 6, an evaluation apparatus (not illustrated) generates a signal corresponding to the detected actuation in the manner of a switch signal for controlling a function of the motor vehicle.

LIST OF REFERENCE SIGNS

2 Display element
4 Projection apparatus
6 Control element
8 Viewing surface
10 Capacitive proximity sensor
12 Light source
14 First lens
16 Projection object
18 Reflection surface
20 Three-dimensional control device
22 Second lens
24 Third lens
26 Light beam

What is claimed is:

1. A control device for a motor vehicle, comprising
a display element;
a projection apparatus configured to project at least one control element onto a viewing surface of the display element, wherein the viewing surface is on a first side of the display element, wherein the projection apparatus comprises:
a light source and at least one lens located on a second side of the display element opposite the first side of the display element; and
a reflection surface located on a second, opposite side of the display element; and
a capacitive proximity sensor configured to detect an actuation of the control element,
wherein the reflection surface is a different surface from the viewing surface and faces the viewing surface, and wherein the reflection surface is configured to receive light beams from the light source and the at least one lens and to reflect reflected light beams from the reflection surface toward the viewing surface and onto the viewing surface.

2. The control device according to claim 1, wherein the display element is non-conductive.

3. The control device according to claim 2, wherein the capacitive proximity sensor is arranged at a side of the display element that lies opposite the viewing surface.

4. The control device according to claim 2, comprising:
a shielding apparatus for selectively influencing an effective region of the capacitive proximity sensor.

5. The control device according to claim 2, wherein the projection apparatus comprises:
the light source configured to generate the light beams;
a plurality of lenses, including the at least one lens, configured to capture and parallelize the light beams;
a projection object to be projected; and
the reflection surface with which the reflected light beams are projected onto the viewing surface as the control element.

6. The control device according to claim 2, comprising:
an evaluation apparatus configured to generate a switch signal corresponding to the detected actuation, wherein the switch signal is configured to control and/or trigger a function.

7. The control device according to claim 1, wherein the display element is a textile, a leather, and/or an imitation leather.

8. The control device according to claim 7, wherein the capacitive proximity sensor is arranged at a side of the display element that lies opposite the viewing surface.

9. The control device according to claim 1, wherein the capacitive proximity sensor is arranged at a side of the display element that lies opposite the viewing surface.

10. The control device according to claim 9, comprising:
a shielding apparatus for selectively influencing an effective region of the capacitive proximity sensor.

11. The control device according to claim 9, wherein the projection apparatus comprises:
the light source configured to generate the light beams;
a plurality of lenses, including the at least one lens, configured to capture and parallelize the light beams;
a projection object to be projected; and
the reflection surface with which the reflected light beams are projected onto the viewing surface as the control element.

12. The control device according to claim 9, comprising:
an evaluation apparatus configured to generate a switch signal corresponding to the detected actuation, wherein the switch signal is configured to control and/or trigger a function.

13. The control device according to claim 1, comprising:
a shielding apparatus for selectively influencing an effective region of the capacitive proximity sensor.

14. The control device according to claim 13, comprising:
an evaluation apparatus configured to generate a switch signal corresponding to the detected actuation, wherein the switch signal is configured to control and/or trigger a function.

15. The control device according to claim 1, wherein the projection apparatus comprises:
the light source configured to generate the light beams;
a plurality of lenses, including the at least one lens, configured to capture and parallelize the light beams;
a projection object to be projected; and
the reflection surface with which the reflected light beams are projected onto the viewing surface as the control element.

16. The control device according to claim 1, wherein the reflection surface is configured to be arranged at a three-dimensional control device configured to control a function of the motor vehicle.

17. The control device according to claim 1, comprising:
an evaluation apparatus configured to generate a switch signal corresponding to the detected actuation, wherein the switch signal is configured to control and/or trigger a function.

* * * * *